(12) United States Patent
Booth et al.

(10) Patent No.: US 8,692,603 B2
(45) Date of Patent: Apr. 8, 2014

(54) METHODS, APPARATUSES, AND CIRCUITS FOR BIMODAL DISABLE CIRCUITS

(71) Applicant: Micron Technology, Inc., Boise, ID (US)

(72) Inventors: Eric Booth, Boise, ID (US); Tyler J. Gomm, Boise, ID (US); Kallol Mazumder, Plano, TX (US); Scott E. Smith, Plano, TX (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/975,100

(22) Filed: Aug. 23, 2013

(65) Prior Publication Data

US 2014/0002148 A1    Jan. 2, 2014

Related U.S. Application Data

(63) Continuation of application No. 13/333,850, filed on Dec. 21, 2011, now Pat. No. 8,519,767.

(51) Int. Cl.
*H03K 3/00* (2006.01)

(52) U.S. Cl.
USPC ............ 327/291; 327/298; 377/119; 377/120

(58) Field of Classification Search
USPC .......... 327/291, 298–299; 377/119–120, 128
See application file for complete search history.

(56) References Cited

U.S. PATENT DOCUMENTS

| | | |
|---|---|---|
| 7,564,264 B1 | 7/2009 | Morrison et al. |
| 7,834,515 B2 | 11/2010 | Tanimura |
| 7,948,261 B2 | 5/2011 | Kawakami |
| 7,982,518 B1 * | 7/2011 | Kaczynski ................ 327/291 |
| 8,013,635 B2 | 9/2011 | Jain et al. |
| 2009/0160515 A1 | 6/2009 | Warnock |
| 2010/0102872 A1 | 4/2010 | Wu et al. |
| 2013/0163713 A1 | 6/2013 | Booth |

* cited by examiner

*Primary Examiner* — An Luu
(74) *Attorney, Agent, or Firm* — Dorsey & Whitney LLP

(57) ABSTRACT

Circuits, integrated circuits, and methods are disclosed for bimodal disable circuits. In one such example method, a counter is maintained, with the counter indicating a logic level at which an output signal will be disabled during at least a portion of one of a plurality of disable cycles. The logic level indicated by the counter is transitioned. An input signal is provided as the output signal responsive to the enable signal indicating that the output signal is to be enabled, and the output signal is disabled at the logic level indicated by the counter responsive to the enable signal indicating that the output signal is to be disabled.

21 Claims, 8 Drawing Sheets

METHODS, APPARATUSES, AND CIRCUITS FOR BIMODAL DISABLE CIRCUITS

CROSS-REFERENCE TO RELATED APPLICATION

This application is a continuation of U.S. patent application Ser. No. 13/333,850, filed Dec. 21, 2011, which is hereby incorporated by reference in its entirety for all purposes.

TECHNICAL FIELD

Embodiments of the invention relate generally to integrated circuits, and more particularly, in one or more of the illustrated embodiments, to bimodal disable circuits.

BACKGROUND OF THE INVENTION

Devices in integrated circuits are frequently subject to various types of degradation. For example, p-channel field effect transistors (pFETs) may be affected by Negative Bias Temperature Instability (NBTI) due to a negative gate bias applied to the pFETs for prolonged periods of time. The NBTI may cause the threshold voltage of the pFETs to rise due to the creation of lattice imperfections at the boundary of the oxide and silicon.

One type of circuit that may experience problems due to NBTI degradation and its associated effects is a clock distribution circuit in which the transitioning of the clock between logic high and low can be selectively disabled. A clock distribution circuit with many inverters connected in series, for example, may have its input selectively disabled in order to conserve power that would otherwise be consumed by continuously transitioning the series-connected inverters. The input to the clock distribution circuit may be selectively disabled by, for example, using a control gate (e.g., a NAND gate) and a control signal (e.g., an enable signal). Where a NAND gate is used as the control gate, the clock and enable signals are input to the NAND gate and the output of the NAND gate is provided as the input to the clock distribution circuit. The input to the clock distribution circuit may be disabled by bringing the enable signal to logic low in order to assure that, regardless of the clock signal, the input to the clock distribution circuit is always logic high. When the input to the clock distribution circuit is logic high, every other inverter will have a conductive pFET and a non-conductive nFET, with the alternating inverters having a non-conductive pFET and a conductive nFET. In this state, the pFET of every other inverter may experience NBTI degradation when the clock transitioning is disabled, while the pFETs of the alternating inverters may not similarly degrade. If the input to the clock distribution circuit is always disabled as logic high, the same pFETs will always experience NBTI degradation, while the other pFETs will not experience NBTI degradation during the disabled state of the clock distribution circuit. The uneven degradation of the pFETs may cause duty cycle distortions on clock signals that are subsequently propagated through the clock distribution circuit.

Furthermore, in addition to NBTI, several other types of degradation can affect various operating characteristics of pFETs and/or nFETs, such as their saturation current, threshold voltage, channel mobility, leakage, and so forth. Some of these degradation processes may, similar to NBTI, unevenly wear the pFETs and/or the nFETs depending on the disabled states of the pFETs and/or the nFETs. As just one example of another type of degradation, Carrier Hot Channel (CHC) may affect both nFET and pFET devices. As with NBTI, these other degradation processes may alter the operating characteristics of the pFETs and/or nFETs, which may ultimately distort the duty cycle of a subsequently propagated clock signal or otherwise cause problems.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
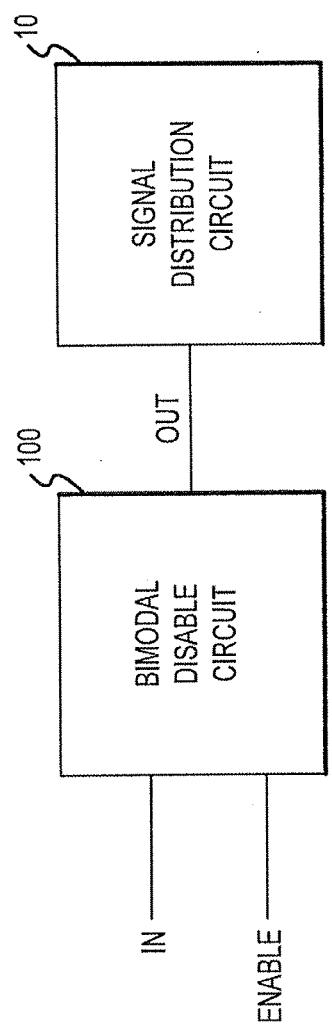
FIG. 1 is a block diagram of an apparatus according to an embodiment of the present invention.

FIG. 1 illustrates an apparatus with a bimodal disable circuit 100 according to an embodiment of the invention. The bimodal disable circuit 100 may receive an input signal IN (which may be, for example, an external clock signal) and an ENABLE signal (which may be, for example, an external clock enable signal) at its input, and may provide an output signal OUT at its output. The bimodal disable circuit 100 may provide the OUT signal, for example, by propagating the IN signal, by generating an internal signal, and so forth. The OUT signal provided by the bimodal disable circuit 100 may be selectively disabled. The bimodal disable circuit 100 may disable the OUT signal, for example, by providing a logic high or a logic low signal (which may be internally generated). The OUT signal may be provided at least partially in response to the IN signal and the ENABLE signal. For example, the bimodal disable circuit 100 may provide the IN signal as the OUT signal (e.g., by propagating the IN signal through to the output of the bimodal disable circuit 100 with a slight propagation delay) when the ENABLE signal is a logic high. As explained in more detail below, when the ENABLE signal is a logic low, the bimodal disable circuit 100 may disable the OUT signal, and the logic level of the disabled OUT signal may be based, at least in part, on the state of an internal mechanism, such as a counter (not illustrated in FIG. 1).

The OUT signal may be provided to a signal distribution circuit 10. The signal distribution circuit 10 may be, for example, a clock synchronization circuit (e.g., a delay-locked loop), a delay line, a clock distribution circuit, a string of series connected devices such as inverters or other logic gates, and so forth. In some cases, it may be desirable to preserve the duty cycle of one or more signals as they propagate through the signal distribution circuit 10.

As mentioned above, the ENABLE signal may indicate what should be provided as the OUT signal from the bimodal disable circuit 100 to the signal distribution circuit 10. For example, a logic high ENABLE signal may indicate that the IN signal is to be provided to the signal distribution circuit 10 (OUT signal enabled), whereas a logic low ENABLE signal may indicate that the IN signal is not to be provided to the signal distribution circuit 10 and instead, the OUT signal is to be disabled. When disabled, the logic level of the disabled OUT signal may be either a logic high or a logic low. An internal mechanism, such as a counter, may indicate whether the logic level of the disabled OUT signal is a logic high or a logic low.

The bimodal disable circuit 100 may maintain a counter indicating a logic level of the disabled OUT signal during a current or a subsequent disable cycle, which may be a period of time during which the ENABLE signal is logic low. In order to help prevent duty cycle distortion in the signal distribution circuit 10, the counter may transition the disabled OUT signal between logic high and logic low for alternating disable cycles. The bimodal disable circuit 100 may do this by transitioning the logic level indicated by the counter during alternating disable cycles.

For example, after a period of providing the IN signal to the signal distribution circuit 10, the first time that the ENABLE signal provided to the bimodal disable circuit 100 transitions to a logic low, the OUT signal may be disabled as a logic high (i.e., the logic level of the disabled OUT signal is a logic high). Next, after the ENABLE signal transitions high and another period of providing the IN signal to the signal distribution circuit 10 passes, the ENABLE signal may again transition low. However, rather than again disabling the OUT signal as a logic high, the OUT signal may be disabled as a logic low (i.e., the logic level of the disabled OUT signal is a logic low). After another cycle of the ENABLE signal transitioning high and then low, the OUT signal may be disabled again as a logic high, and so forth. In this manner, the OUT signal is alternately disabled between logic high and logic low for every other disable cycle. The disabled OUT signal will thus have a different logic level during a current disable cycle than during a previous disable cycle.

If the signal distribution circuit 10 is a chain of series-connected inverters, as the case may be in a clock distribution chain, the transitioning of the logic level of the disabled OUT signal may change the conductivity of the nFETs and pFETs of the inverters during alternating disable cycles. For example, during a first enable cycle, the nFET of the first inverter may be conductive, with its pFET non-conductive. The nFET of the second inverter may be non-conductive, with its pFET conductive. The nFET of the third inverter may be conductive, with its pFET non-conductive, and so forth. Then, during a second enable cycle, the nFET of the first inverter may be non-conductive, with its pFET conductive. The nFET of the second inverter may be conductive, with its pFET non-conductive. The nFET of the third inverter may be non-conductive, with its pFET conductive, and so forth.

In this manner, the nFETs and pFETs of the inverters may alternately be disabled in conductive and non-conductive states for every other disable cycle. As such, the nFETs and/or the pFETs may degrade more evenly than would otherwise be the case if each FET was always disabled in the same state. Although the duration of the various disable cycles may vary (e.g., the first cycle may be shorter than the second cycle, and the third cycle may also be shorter than the second cycle), over time, the amount of time that each nFET and each pFET is disabled in a conductive and non-conductive state may even out. Accordingly, the amount of degradation (e.g., NBTI degradation) experienced by each of the pFETs and/or nFETs may be more even over time. This may, in turn, help preserve the duty cycle of one or more signals as they are subsequently propagated through the signal distribution circuit 10.

Figure 2:
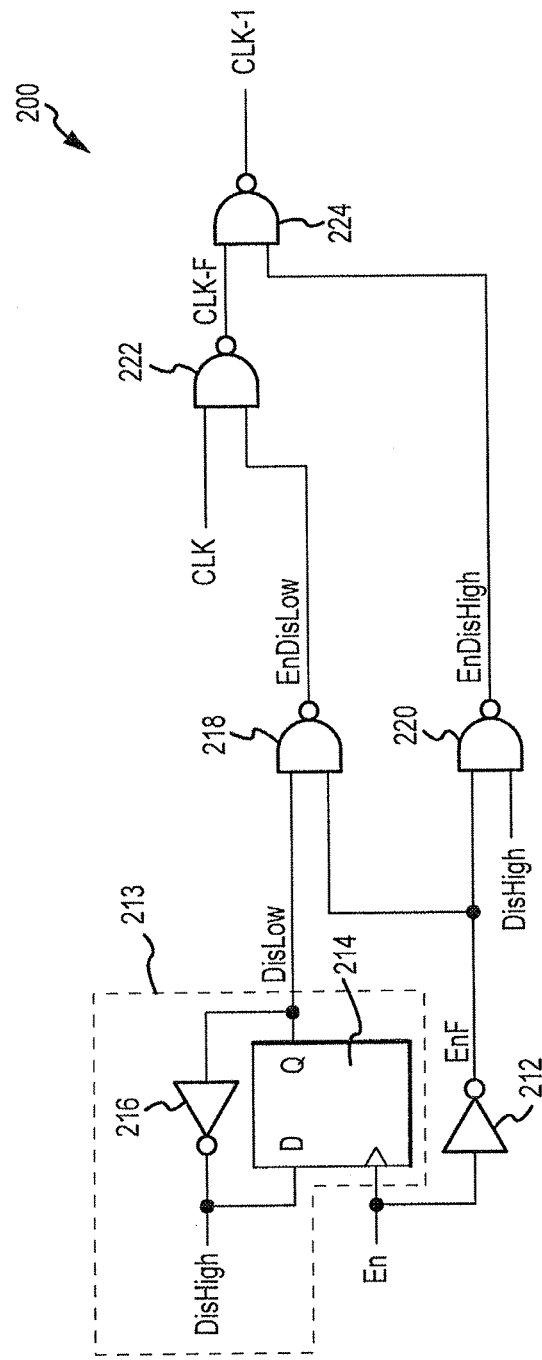
FIG. 2 is a schematic diagram of a bimodal disable circuit according to an embodiment of the invention.

FIG. 2 illustrates an embodiment of a bimodal disable circuit 200, which may be used for the bimodal disable circuit 100 illustrated in FIG. 1. The bimodal disable circuit 200 in FIG. 2 may receive an enable signal En and an external clock signal CLK, and may provide at its output an output signal CLK-1, which may be selectively disabled during one or more disable cycles. In at least one embodiment, the output signal could be used as an internal clock signal. The En signal may be a clock enable signal, and it and the CLK signal may be provided by a source external to the apparatus or circuit incorporating the bimodal disable circuit 200. The CLK-1 signal may be provided to a signal distribution circuit, such as the signal distribution circuit 10 illustrated in FIG. 1 and described above. The signal distribution circuit to which CLK-1 is provided may be, for example, a clock distribution circuit, a clock synchronization circuit, and so forth.

The bimodal disable circuit 200 may include a first inverter 212, which may provide a complementary enable signal EnF by inverting the En signal. The bimodal disable circuit 200 may also include a counter 213. In some embodiments, the counter 213 may be a transitioning counter, and may include a rising-edge triggered flip-flop 214 and a second inverter 216, with the second inverter 216 coupling the output (Q) of the flip-flop 214 to its input (D). In some embodiments, the flip-flop 214 may include a reset input to ensure that it is initialized in a known state.

The En signal may be provided as the clock input to the flip-flop 214. The output of the flip-flop 214 may be a disable low signal DisLow, and the inverter 216 may invert the DisLow signal to provide a disable high signal DisHigh. In this arrangement, the counter 213 may transition the DisHigh and DisLow signal logic levels responsive to each rising transition of the En signal. For example, if the DisLow signal is logic low and the DisHigh signal is logic high, at the next rising transition of the En signal, the counter 213 may transition the DisLow signal to become logic high and the DisHigh signal will correspondingly become logic low.

The DisLow signal and the EnF signal may be provided to a first control gate 218, illustrated as a NAND gate in FIG. 2, which may provide in response an enable-disable-low signal EnDisLow. The DisHigh signal and the EnF signal may be provided to a second control gate 220, also illustrated as a NAND gate in FIG. 2, which may provide in response an enable-disable-high signal EnDisHigh. The EnDisLow and CLK signals may be provided to a third control gate 222, also illustrated as a NAND gate in FIG. 2, which may provide in response a complementary clock signal CLK-F (which may be selectively disabled). The EnDisHigh and the CLK-F signals may be provided to a fourth control gate 224, also illustrated as a NAND gate in FIG. 2, which may provide in response the CLK-1 signal (which also may be selectively disabled). As described above, the CLK-1 signal may be provided to a signal distribution circuit, such as a clock distribution circuit.

Figure 3:
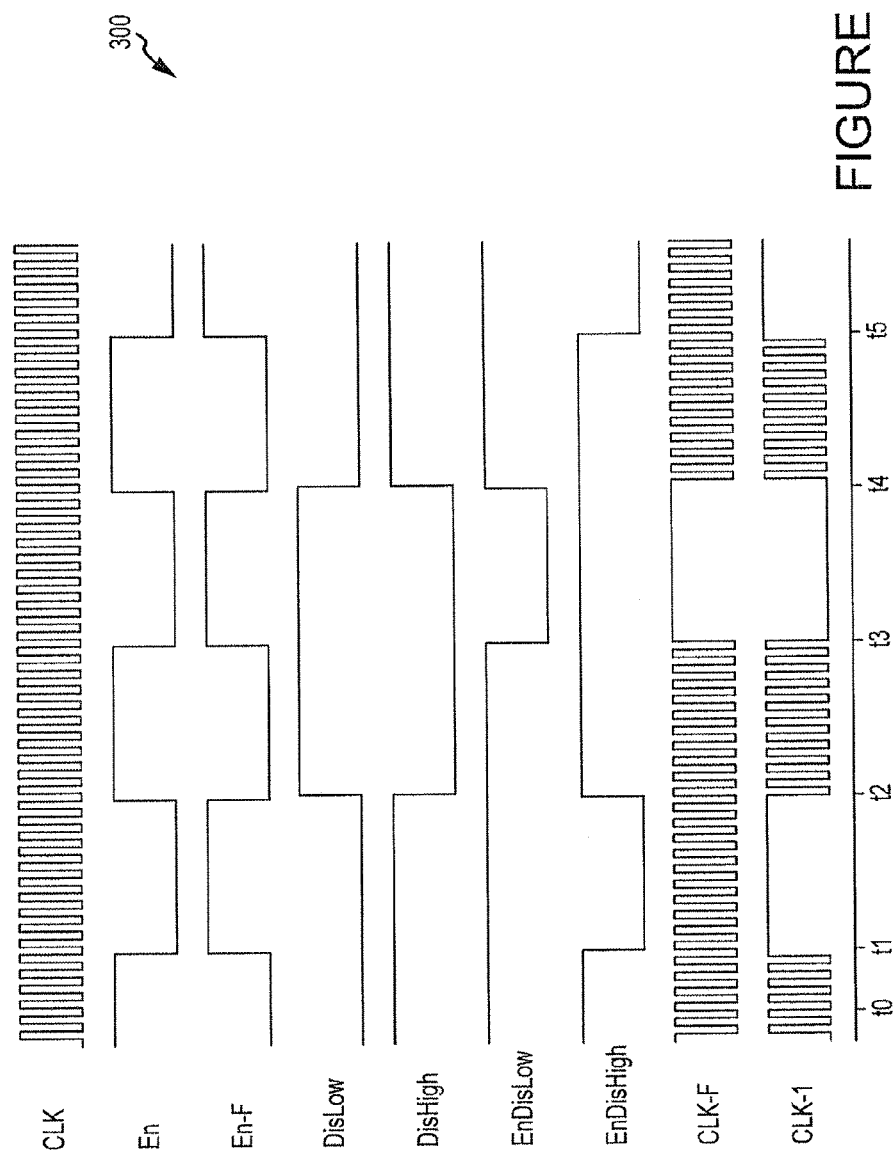
FIG. 3 is a timing diagram for the bimodal disable circuit of FIG. 2 according to an embodiment of the invention.

With reference now to the schematic diagram of FIG. 2 and the timing diagram 300 of FIG. 3, the operation of the bimodal disable circuit 200 will be described. At a first time, t0, the En signal may be logic high, which may indicate that the CLK signal is to be provided as the CLK-1 signal. To this end, the inverter 212 may invert the logic high En signal and provide a logic low EnF signal. The logic low EnF signal may cause the first and second control gates 218, 220 to provide a logic high EnDisLow and a logic high EnDisHigh signal, respectively, regardless of the logic level of the DisLow and DisHigh signals. The logic high EnDisLow signal may cause the third control gate 222 to provide the CLK signal as the CLK-F signal. In some embodiments, including the bimodal disable circuit 200 illustrated in FIG. 2, the third control gate 222 may invert the CLK signal in providing it as the CLK-F signal, whereas in other embodiments, the third control gate 222 may not invert the CLK signal, but rather provide the un-inverted CLK signal as the CLK-F signal. The logic high EnDisHigh signal may cause the fourth control gate 224 to provide the CLK-F signal as the CLK-1 signal. In some embodiments, including the bimodal disable circuit 200 illustrated in FIG. 2, the fourth control gate 224 may invert the CLK-F signal in providing it as the CLK-1 signal, whereas in other embodiments, the fourth control gate 224 may not invert the CLK-F signal, but rather provide the un-inverted CLK-F signal as the CLK-1 signal. As illustrated in FIG. 3, when the En signal is logic high, the third and fourth control gates 222, 224 may provide the CLK signal as the CLK-1 signal, although the CLK-1 signal may be slightly delayed from the CLK signal due to the propagation delay of control gates 222, 224.

After some period of time, the En signal may transition to logic low at time t1, which transition may be, for example, in response to a command to disable the CLK-1 signal from transitioning between logic high and low. In response to the En signal transitioning to logic low, the EnF signal may transition to logic high, which may cause the second control gate 220 to provide a logic low EnDisHigh signal, while the first control gate 218 provides a logic high EnDisLow signal. The transitioning of the EnDisHigh signal to a logic low may cause the fourth control gate 224 to stop providing the CLK and CLK-F signals as the CLK-1 signal, and instead cause the fourth control gate 224 to disable the CLK-1 signal as a logic high. Therefore, the logic level of the disabled CLK-1 signal may be a logic high for a period of time, as illustrated in FIG. 3.

After that period of time, the En signal may transition back to logic high at time t2, which transition may be, for example, in response to a command to re-enable the transitioning of the CLK-1 signal. In response to the En signal transitioning to logic high, the EnF signal may transition to logic low, which may cause the first and second control gates 218, 220 to provide a logic high EnDisLow and a logic high EnDisHigh signal, respectively, regardless of the logic level of the Dis-Low and the DisHigh signals. The logic high EnDisLow signal may cause the third control gate 222 to invert and provide the CLK signal as the CLK-F signal. The logic high EnDisHigh signal may cause the fourth control gate 224 to invert and provide the CLK-F signal as the CLK-1 signal. As illustrated in FIG. 3, when the En signal is again logic high, the third and fourth control gates 222, 224 may provide the CLK signal as the CLK-1 signal, with a slight delay.

After another period of time, the En signal may again transition to logic low at time t3, which transition may be, for example, in response to another command to disable the CLK-1 signal from transitioning between logic high and low. In response to the En signal transitioning to logic low, the EnF signal may transition to logic high, which may cause the first control gate 218 to provide a logic low EnDisLow signal, while the second control gate 220 provides a logic high EnDisHigh signal. The transitioning of the EnDisLow signal to a logic low may cause the third control gate 222 to stop providing the CLK signal to the fourth control gate 224, and instead cause the third control gate 222 to provide a logic high signal, in turn causing the fourth control gate 224 to disable the CLK-1 signal as a logic low. Therefore, the logic level of the disabled CLK-1 signal may be a logic low for a period of time, as illustrated in FIG. 3.

After that period of time, the En signal may transition back to logic high at time t4, which transition may be, for example, in response to a command to re-enable the transitioning of the CLK-1 signal. In response to the En signal transitioning to logic high, the EnF signal may transition to logic low, which may cause the first and second control gates 218, 220 to provide a logic high EnDisLow and a logic high EnDisHigh signal, respectively, regardless of the logic level of the Dis-Low and the DisHigh signals. The logic high EnDisLow signal may cause the third control gate 222 to invert and provide the CLK signal as the CLK-F signal. The logic high EnDisHigh signal may cause the fourth control gate 224 to invert and provide the CLK-F signal as the CLK-1 signal. As illustrated in FIG. 3, when the En signal is again logic high, the third and fourth control gates 222, 224 may provide the CLK signal as the CLK-1 signal, with a slight delay.

After another period of time, the En signal may transition again to logic low at time t5, which transition may be, for example, in response to a command to disable the CLK-1 signal from transitioning. In response to the En signal transitioning to logic low, the EnF signal may transition to logic high, which may cause the second control gate 220 to provide a logic low EnDisHigh signal, while the first control gate 218 provides a logic high EnDisLow signal. The transitioning of the EnDisHigh signal to a logic low may cause the fourth control gate 224 to stop providing the CLK and CLK-F signals as the CLK-1 signal, and instead cause the fourth control gate 224 to disable the CLK-1 signal as a logic high. Therefore, the logic level of the disabled CLK-1 signal may once again be a logic high for a period of time, as illustrated in FIG. 3.

As illustrated in FIG. 3, and as just explained, the bimodal disable circuit 200 illustrated in FIG. 2 may transition the logic level of the disabled CLK-1 signal between logic high and logic low for alternating disable cycles, which may be the periods of time during which the En signal is logic low. As explained above, the CLK-1 signal may transition at the same frequency as the CLK signal at time t1, then may be disabled as a logic high between time t1 and time t2. Beginning at time t2, the CLK-1 signal may again transition at the same frequency as the CLK signal, until time t3, when the CLK-1 signal is disabled as a logic low between time t3 and t4. Beginning at time t4, the CLK-1 signal may again transition at the same frequency as the CLK signal, until time t5, when the CKL-1 signal is again disabled as a logic high, and so forth.

The counter 213 in the bimodal disable circuit 200 in FIG. 2 may reduce glitching of the CLK-1 signal by transitioning the DisLow and DisHigh signals on the rising edge of the En signal, so that DisLow and DisHigh are stable when the En signal transitions low and the bimodal disable circuit 200 disables the transitioning of the CLK-1 signal. In other embodiments, such as glitch tolerant embodiments, the Dis-Low and/or the DisHigh signals may be transitioned on the falling edge of the En signal.

In some embodiments, the third and fourth control gates 222, 224 may be substantially identical, in which case the similarity between them may help to naturally preserve the duty cycle of signals provided through the third and fourth control gates 222, 224 because should the third control gate 222 distort, skew, etc. the CLK signal in providing the CLK-F signal, the fourth control gate 224 may undistort, unskew, etc. the CLK-F signal provided by the third control gate 22 in providing the CLK-1 signal. The control gates 222, 224 may be substantially identical in that they are, in some embodiments, the same type of control gate (e.g., NAND gates), and are physically sized within +/−10% of one another. The control gates 222, 224 may also or alternatively have substantially identical drive strengths (e.g., within +/−10 of one another), regardless of the type or physical size of the gates.

Figure 4:
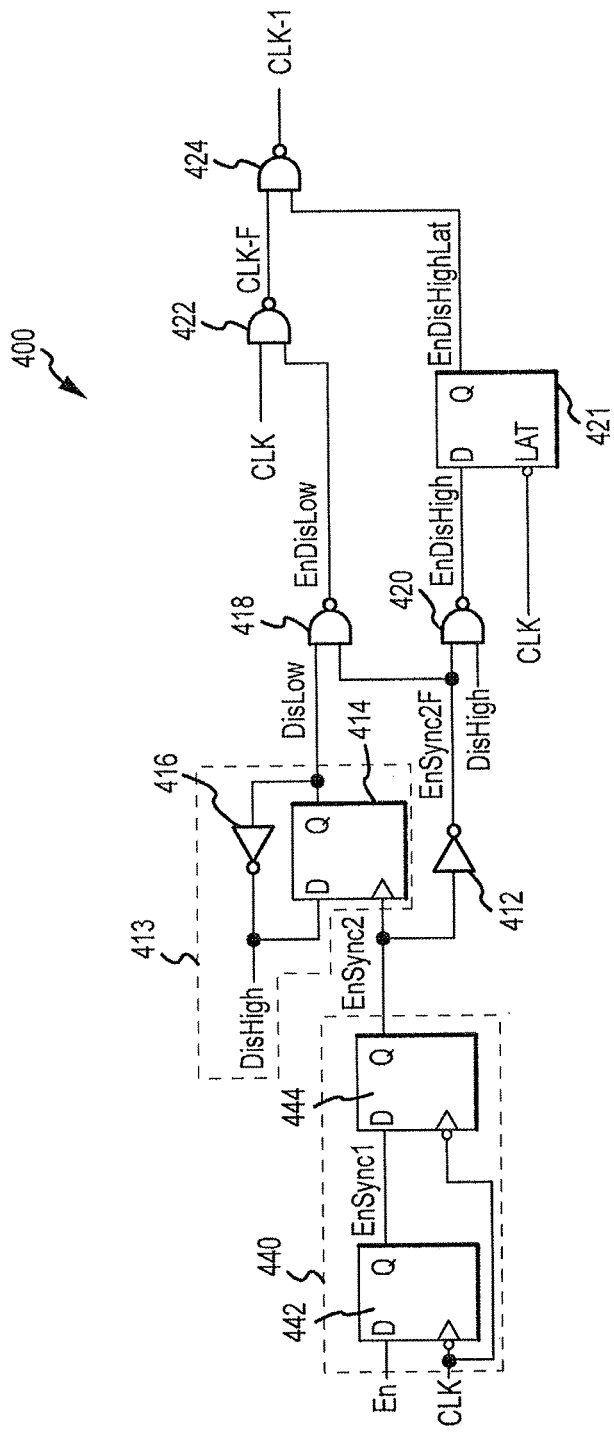
FIG. 4 is a schematic diagram of a bimodal disable circuit according to an embodiment of the invention.

FIG. 4 illustrates another embodiment of a bimodal disable circuit 400. The bimodal disable circuit 400 may be used for the bimodal disable circuit 100 illustrated in FIG. 1, and is similar to the bimodal disable circuit 200 illustrated in FIG. 2. Like the bimodal disable circuit 200 illustrated in FIG. 2, the bimodal disable circuit 400 illustrated in FIG. 4 may receive an En signal and a CLK signal, and in response provide a CLK-1 signal, which may be provided to a signal distribution circuit, such as the signal distribution circuit 10 illustrated in FIG. 1 and described above. As above, the CLK-1 signal may be selectively disabled during one or more disable cycles. Also like the bimodal disable circuit 200 illustrated in FIG. 2, the bimodal disable circuit 400 illustrated in FIG. 4 may include an inverter 412, a counter 413 (with, for example, a rising-edge triggered flip-flop 414 and an inverter 416), and first, second, third, and fourth control gates 418, 420, 422, 424.

The bimodal disable circuit 400 in FIG. 4 may, however, additionally include a synchronizer 440, which may help synchronize asynchronous enable signals to help alleviate problems associated with asynchronous enable signals (such as metastability, delays, etc.). The bimodal disable circuit 400 in FIG. 4 may also include a level sensitive latch 421, which may help reduce glitching (such as, for example, truncated pulses) of the CLK-1 signal in high speed or glitch sensitive circuits for example. The bimodal disable circuit 400 in FIG. 4 may be used in many types of circuits and apparatuses, including those where the CLK signal has true polarity at the point where the bimodal disable circuit 400 is coupled. A CLK signal with true polarity may be a clock signal that is asserted as logic high.

The synchronizer 440 may include a plurality of flip-flops 442, 444, which may be used to synchronize the En signal (which may be asynchronous) with the falling edge of the CLK signal in order to help synchronize the enable/disable of CLK-F and/or CLK-1. As illustrated in FIG. 4, the flip-flops 442, 444 are rising-edge triggered flip-flops, but they receive an inverted CLK signal. Alternatively, the flip-flops 442, 444 may be falling-edge triggered flip-flops that receive the CLK signal. Or, the flip-flops 442, 444 may alternatively be arranged to synchronize the En signal with the rising edge of the CLK signal (as, for example in the bimodal disable circuit 600 illustrated in FIG. 6 and described below). Although not illustrated in FIG. 4, the flip-flops 442, 444 (and also the flip-flop 414 in the counter 413) may each include a reset input to ensure that they are initialized in a known state. Also, although not illustrated in FIG. 4, the inverted CLK signal received by the flip-flops 442, 444 may be generated in a phase splitter.

As mentioned, the synchronizer 440 receives the En signal, and provides the EnSync2 signal, which is synchronized with the falling edge of the CLK signal. The EnSync2 signal may be provided to the inverter 412 and to the flip-flop 414 in the counter 413. The counter 413 may, similar to the counter 213 in the bimodal disable circuit 200 in FIG. 2, transition the DisHigh and DisLow signal logic levels responsive to each rising transition of the EnSync2 signal.

The bimodal disable circuit 400 includes first, second, third, and fourth control gates 418, 420, 422, 424, similar to the four control gates 218, 220, 222, 224 in the bimodal disable circuit 200 in FIG. 2. The DisLow signal and the EnSync2F signal may be provided to the first control gate 418, illustrated as a NAND gate in FIG. 4, which may provide in response an enable-disable-low signal EnDisLow. The DisHigh signal and the EnSync2F signal may be provided to the second control gate 420, also illustrated as a NAND gate in FIG. 4, which may provide in response an enable-disable-high signal EnDisHigh. The EnDisLow and the CLK signals may be provided to a third control gate 422, also illustrated as a NAND gate in FIG. 4, which may provide in response a clock-false signal CLK-F (which may be selectively disabled). Before being provided to the fourth control gate 424, however, the EnDisHigh signal may be delayed in the latch 421 (and subsequently provided as the EnDisHighLat signal) until the CLK-F signal transitions to logic low, as explained in more detail below. The latch 421 provides the EnDisHighLat signal, and this signal along with the CLK-F signal are provided to the fourth control gate 424, which may provide in response the CLK-1 output signal (which also may be selectively disabled). The CLK-1 signal may in turn be provided to a signal distribution circuit, such as a clock distribution circuit.

The latch 421 may help reduce glitching of the CLK-1 signal that may otherwise occur if the EnDisHigh signal transitions while CLK-F is logic high. In order to reduce such glitching, the level sensitive latch 421 may delay the EnDisHigh signal transition until the CLK-F signal is logic low. The level sensitive latch 421 may pass its data input ('D') to its data output ('Q') when the LAT input is logic low, and may hold its data output stable (e.g., capture the data) when the LAT input is a logic high. To this end, an inverted CLK signal may be provided to the LAT input (as illustrated in FIG. 4), or alternatively the CLK-F signal may be provided to the LAT input, or an inverted clock signal from another source such as a phase splitter may be provided to the LAT input. In this configuration, and as explained below, the latch 421 may help ensure that EnDisHighLat only transitions when CLK-F is logic low (which may only happen if CLK is logic high and EnDisLow is logic high).

Figure 5:
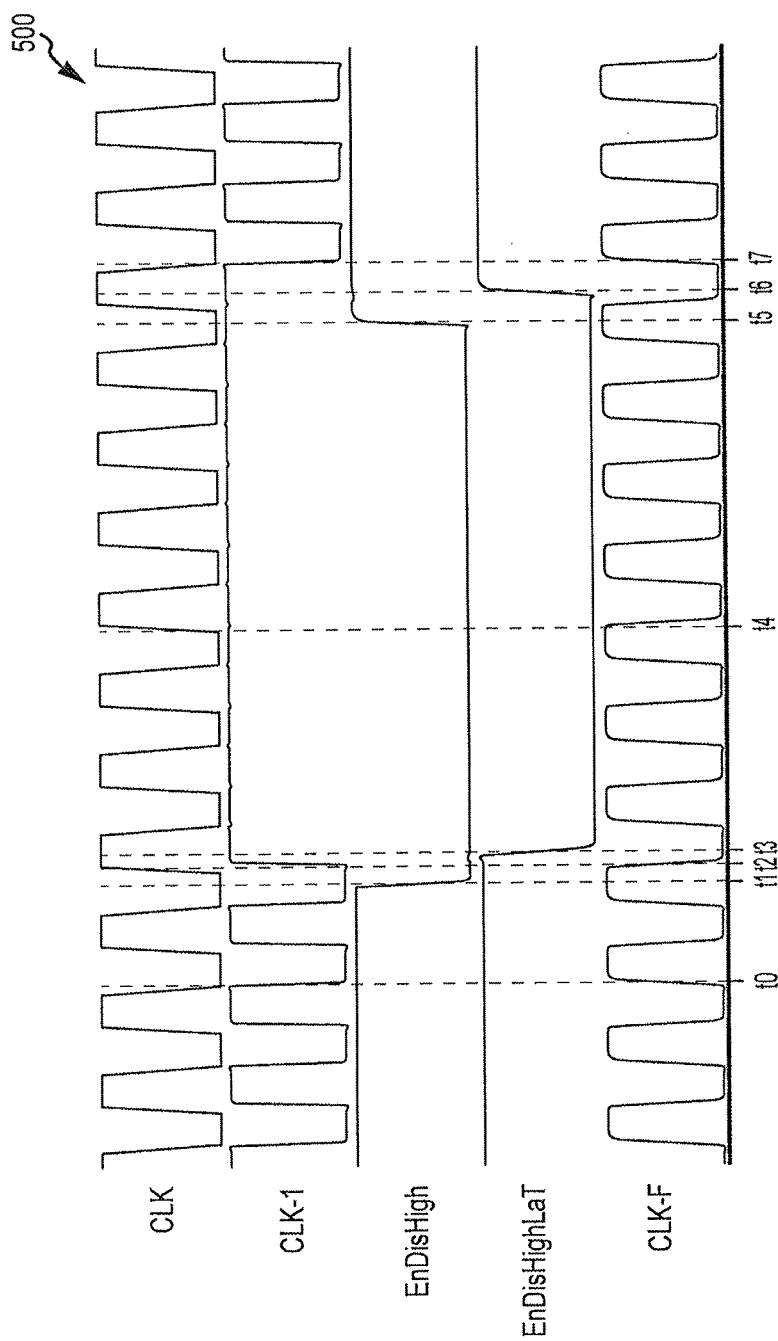
FIG. 5 is a timing diagram for the bimodal disable circuit of FIG. 4 according to an embodiment of the invention.

With reference now to the schematic diagram of FIG. 4 and the timing diagram 500 of FIG. 5, the operation of the latch 421 of the bimodal disable circuit 400 will be described. At time t0, the En signal may be logic high, which results in the CLK-1 signal transitioning at the same frequency as the CLK signal. However, in response to the En signal transitioning to logic low, the EnDisHigh signal may also transition low at time t1. However, as illustrated in FIG. 5, at time t1 when the EnDisHigh signal is transitioning to logic low, the CLK-F signal is logic high. If the EnDisHigh signal were provided to the fourth control gate 424 at time t1 (without first passing through the latch 421), the CLK-1 signal may have a glitch, which may be that the CLK-1 signal transitions to logic high prematurely (e.g., before the CLK signal transitions to logic high). However, because latch 421 is in place in the bimodal disable circuit 400 in FIG. 4, the latch 421 delays the EnDisHigh signal, which allows the CLK-1 signal to transition to logic high, at time t2 in response to the CLK-F signal transitioning to logic low (which occurs because the CLK signal transitions to logic high), thus providing a non-truncated pulse. After the CLK-1 signal safely transitions to logic high at time t2, the EnDisHighLat signal provided by the latch 421, which is released from the latch at time t3, holds the CLK-1 signal as logic high through time t4 and for the remainder of the disable cycle (e.g., until the En signal is again asserted as logic high).

Still with reference to the timing diagram 500 illustrated in FIG. 5, the EnDisHigh signal may transition to logic high at time t5 in response to the En signal transitioning to logic high. Once again, however, at time t5, the CLK-F signal is logic high. As before, if the EnDisHigh signal were provided to the fourth control gate 424 at time t5 (without first passing through the latch 421), the CLK-1 signal may have a glitch, which may be that the CLK-1 signal transitions to logic low prematurely (e.g., the CLK-1 signal transitions to logic low in the middle of the CLK period, as opposed to just after or at the same time as the CLK signal transitions low). However, because latch 421 is in place in the bimodal disable circuit 400 in FIG. 4, the latch 421 delays the transition of the EnDisHigh signal which allows the CLK-1 signal to stay at logic high until time t7 when the CLK signal transitions to logic low. While the CLK-1 signal remains logic high at time t6, the EnDisHighLat signal provided by the latch 421 is released from the latch at time t6, and as mentioned, the CLK-1 signal transitions to logic low at time t7 along with the CLK signal transition to logic low at time t7.

Figure 6:
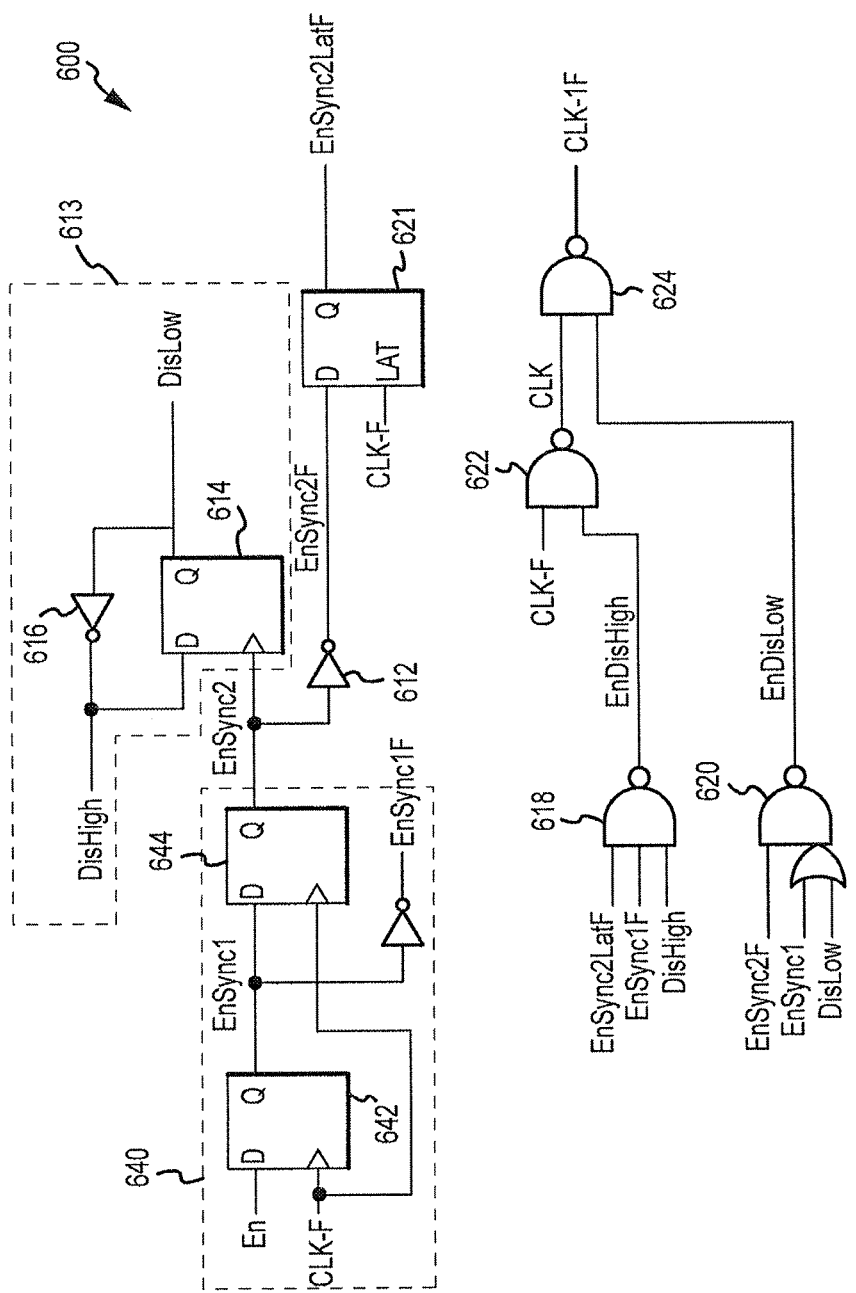
FIG. 6 is a schematic diagram of a bimodal disable circuit according to an embodiment of the invention.

FIG. 6 illustrates another embodiment of a bimodal disable circuit 600. The bimodal disable circuit 600 may be used for the bimodal disable circuit 100 illustrated in FIG. 1, and is similar to the bimodal disable circuit 200 illustrated in FIG. 2 and/or the bimodal disable circuit 400 illustrated in FIG. 4. Like the bimodal disable circuit 400 illustrated in FIG. 4, the bimodal disable circuit 600 illustrated in FIG. 6 may receive an En signal. The bimodal disable circuit 600 illustrated in FIG. 6 may, however, receive a CLK-F signal, which may be the complement of a true polarity clock signal, which is asserted as logic low. In response to receiving the En and CLK-F signals, the bimodal disable circuit 600 may provide a selectively disableable CLK-1F signal, which may be provided to a signal distribution circuit, such as the signal distribution circuit 10 illustrated in FIG. 1 and described above.

Like the bimodal disable circuit 400 illustrated in FIG. 4, the bimodal disable circuit 600 illustrated in FIG. 6 may include an inverter 612, a counter 613 (with, for example, a rising-edge triggered flip-flop 614 and an inverter 616), and first, second, third, and fourth control gates 618, 620, 622, 624.

The bimodal disable circuit 600 may also include a synchronizer 640, which may help synchronize asynchronous enable signals to help alleviate problems associated with asynchronous enable signals (such as metastability, delays, etc.). The synchronizer 640 may include a plurality of flip-flops 642, 644, which may synchronize the En signal (which may be asynchronous) with the rising edge of the CLK-F signal in order to help synchronize the enable/disable of CLK-F and/or CLK-1. As illustrated in FIG. 6, the flip-flops 642, 644 are rising-edge triggered flip-flops, and they receive the CLK-F signal. As with the synchronizer 440 in FIG. 4, the flip-flops 642, 644 may be alternatively arranged. Although not illustrated in FIG. 6, each of the flip-flops 642, 644 (and also the flip-flop 614 in the counter 613) may include a reset input to ensure that they are initialized in a known state.

As mentioned, the synchronizer 640 receives the En signal, and provides the EnSync2, EnSync1, and EnSync1F signals, with all three signals synchronized with the rising edge of the CLK-F signal. The EnSync2 signal may be provided to the inverter 612 and to the flip-flop 614 in the counter 613. The counter 613 may, similar to the counter 413 in the bimodal disable circuit 400 in FIG. 4, transition the DisHigh and DisLow signal logic levels responsive to each rising transition of the EnSync2 signal. The inverter 612 may provide an EnSync2F signal by inverting the EnSync2 signal.

The bimodal disable circuit 600 in FIG. 6 may also include a level sensitive latch 621, which, similar to the level sensitive latch 421 in the bimodal disable circuit 400 in FIG. 4, may help reduce glitching (such as, for example, truncated pulses) of the CLK-1F signal in high speed or glitch sensitive circuits. The latch 621 in the bimodal disable circuit 600 may function similar to the latch 421 in the bimodal disable circuit 400 discussed above, except that it latches and delays a different signal. That is, the latch 621 may receive the EnSync2F signal and provide the EnSync2LatF signal in response. In this configuration, the latch 621 may help ensure that the EnSync2LatF signal only transitions when the CLK-F signal is logic low.

The bimodal disable circuit 600 includes first, second, third, and fourth control gates 618, 620, 622, 624, similar to the four control gates 418, 420, 422, 424 in the bimodal disable circuit 400 in FIG. 4. The DisHigh signal, the EnSync1F signal, and the EnSync2LatF signal may be provided to the first control gate 618, illustrated as a NAND gate in FIG. 6, which may provide in response an enable-disable-high signal EnDisHigh. The DisLow signal, the EnSync1 signal, and the EnSync2F signal may be provided to the second control gate 620, illustrated as an OR-AND-INVERT or OAI gate in FIG. 6, which may provide in response an enable-disable-low signal EnDisLow.

The EnDisHigh and the CLK-F signals may be provided to the third control gate 622, also illustrated as a NAND gate in FIG. 6, which may provide in response a CLK signal that is selectively disableable. Similarly, the EnDisLow and the CLK signals may be provided to the fourth control gate 624, also illustrated as a NAND gate in FIG. 6, which may provide in response the CLK-1F signal that is also selectively disableable.

Figure 7:
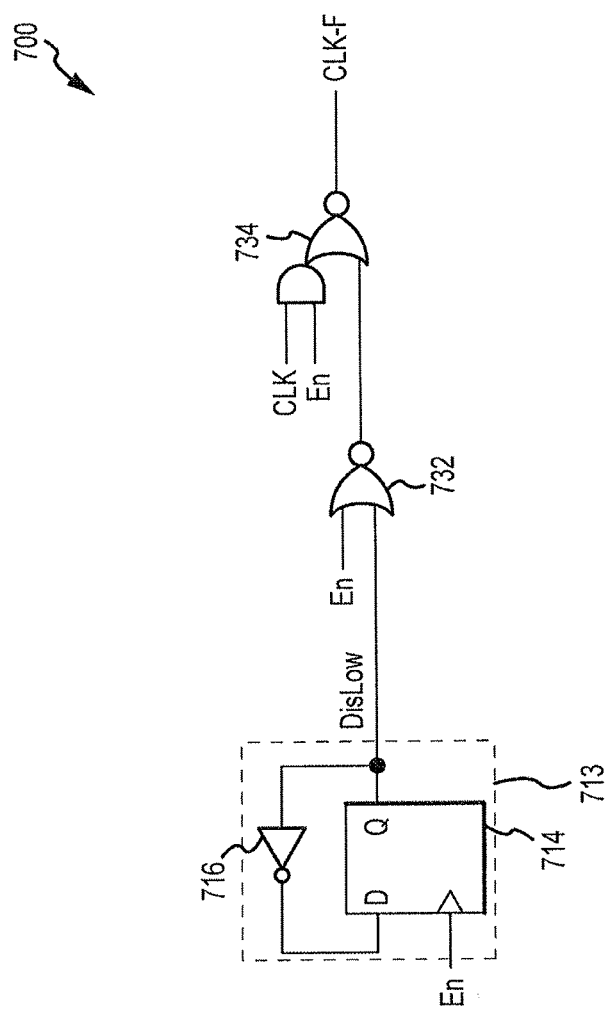
FIG. 7 is a schematic diagram of a bimodal disable circuit according to an embodiment of the invention.

FIG. 7 illustrates another embodiment of a bimodal disable circuit 700. The bimodal disable circuit 700 may be used for the bimodal disable circuit 100 illustrated in FIG. 1, and is similar to the bimodal disable circuit 200 illustrated in FIG. 2, and so forth. Like the bimodal disable circuit 200 illustrated in FIG. 2, the bimodal disable circuit 700 illustrated in FIG. 7 may receive an En signal and an external CLK signal, and may provide an output signal CLK-F that is selectively disableable. The CLK-F signal may be provided to a signal distribution circuit, such as the signal distribution circuit 10 illustrated in FIG. 1 and described above.

Like the bimodal disable circuit 200 illustrated in FIG. 2, the bimodal disable circuit 700 illustrated in FIG. 7 may include a counter 713 (with, for example, a rising-edge triggered flip-flop 714 and an inverter 716), and first and second control gates 732, 734. The counter 713 may be similar to the counter 213 of the bimodal disable circuit 200 illustrated in FIG. 2, and may provide a DisLow signal in response to the En signal. The first control gate 732, illustrated as a NOR gate in FIG. 7, may receive the DisLow signal as well as the En signal. The second control gate 734, illustrated as an AND-OR-INVERT or AOI gate in FIG. 7, may receive the output of the first control gate 732, the CLK signal, and the En signal, and may provide the CLK-F signal in response. As with the other bimodal disable circuits 100, 200, 400, 600, the bimodal disable circuit 700 illustrated in FIG. 7 may selectively enable providing the CLK signal as the CLK-F signal, and may selectively disable the CLK-F signal at alternating logic levels in order to, for example, reduce duty cycle distortions that may result from unevenly degraded pFETs. Unlike the other bimodal disable circuits 100, 200, 400, 600, the bimodal disable circuit 700 illustrated in FIG. 7 may only insert one gate of delay in the clock path (e.g., between CLK and CLK-F). Accordingly, the bimodal disable circuit 700 may be used in, for example, circuits or apparatuses where minimization of the clock delay is desired.

Figure 8:
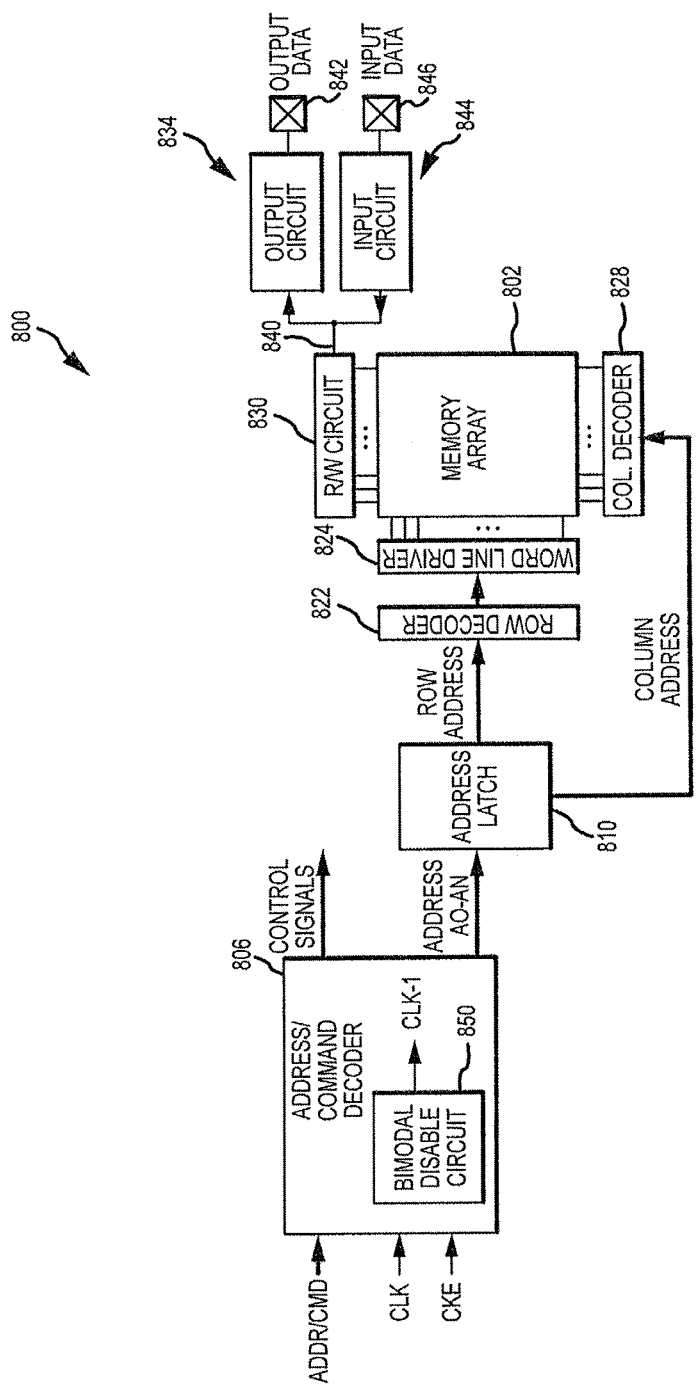
FIG. 8 is a block diagram of a memory having a bimodal disable circuit according to an embodiment of the invention.

FIG. 8 illustrates a portion of a memory 800 according to an embodiment of the present invention. The memory 800 includes an array 802 of memory cells, which may be, for example, DRAM memory cells, SRAM memory cells, flash memory cells, or some other types of memory cells. The memory 800 includes an address/command decoder 806 that receives memory commands and addresses through an ADDR/CMD bus. The address/command decoder 806 provides control signals, based on the commands received through the ADDR/CMD bus. The address/command decoder 806 also provides row and column addresses to the memory 800 through an address bus and an address latch 810. The address latch then outputs separate column addresses and separate row addresses.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line or bit lines) corresponding to a received column address are coupled to a read/write circuitry 830 to provide read data to a data output circuit 834 via an input-output data bus 840. An output pad 842 coupled to the data output circuit 834 is used for electrically coupling to the memory 800. Write data are provided to the memory array 802 through a data input circuit 844 and the memory array read/write circuitry 830. An input pad 846 coupled to the data input circuit 842 is used for electrically coupling to the memory 800. The address/command decoder 806 responds to memory commands and addresses provided to the ADDR/CMD bus to perform various operations on the memory array 802. In particular, the address/command decoder 806 is used to provide internal control signals to read data from and write data to the memory array 802.

The address/command decoder 806 in FIG. 8 also includes a bimodal disable circuit 850 that may be, for example, any of the bimodal disable circuits 100, 200, 400, 600, 700 described herein, or a similar bimodal disable circuit. The bimodal disable circuit may be configured to selectively provide the CLK-1 signal based at least in part on the CLK signal (which may be an external clock signal), and may also be configured to selectively disable the output signal at alternating logic levels when the CKE signal (which may be an external clock enable signal) is logic low. The CLK-1 signal may be provided to, for example a delay-locked loop, a clock distribution circuit, or any type of circuit including a signal distribution circuit.

From the foregoing it will be appreciated that, although specific embodiments of the invention have been described herein for purposes of illustration, various modifications may be made without deviating from the spirit and scope of the invention. For example, FIGS. 1, 2, 4, 6, 7, and 8 include embodiments 100, 200, 400, 600, 700, 850 of a bimodal disable circuit. However, a bimodal disable circuit is not limited to having the same design, and may be of different designs and include circuitry different from the circuitry in the embodiments illustrated in FIGS. 1, 2, 4, 6, 7, and 8. For example, although the bimodal disable circuits 400, 600 illustrated in FIGS. 4 and 6 include synchronizers 440, 640, they need not include a synchronizer, and also, the bimodal circuits 100, 200, 700 illustrated in FIGS. 1, 2, and 7 may include a synchronizer although they are illustrated without one. Also, the synchronizer may include more or less than two series-connected flip-flops, or may include different internal circuitry in addition to or in place of flip-flops.

Also, the bimodal disable circuits 400, 600 illustrated in FIGS. 4 and 6 may, as illustrated and described, include both a synchronizer 440, 640 and a latch 421, 621, whereas in other embodiments the bimodal disable circuits 400, 600 may include only one of, or neither of, a synchronizer and a latch.

Furthermore, the control gates (e.g., 218, 220, 222, 224, 418, 420, 422, 424, etc.) are not limited to the specific type of control gate illustrated in the figures and described above. The third and fourth control gates 222, 224 (illustrated and described as NAND gates) of the bimodal disable circuit 200 in FIG. 2 may, for example, be replaced with a different type of control gate (such as a NOR gate, a tri-state device, and so forth).

Another gate that may be replaced is, for example, the inverters 412, 612 of the bimodal disable circuits 400, 600 illustrated in FIGS. 4 and 6. Although the inverters 412, 612 may be simple CMOS inverters in some embodiments, they may be replaced with one or more phase splitters in order to produce true and complement clocks with no substantial delay between the true clock and the complement clock.

Furthermore, although the counters 213, 413, 613, 713 illustrated in the figures and described above are fairly simple counters, they may in some embodiments be much more complex. For example, a counter in a bimodal disable circuit may keep track of the accumulated time that an output signal is disabled as a particular logic level, and may determine a current or a subsequent disable logic level based on the accumulated time that the output signal has been disabled at the different logic levels. In some embodiments, the counter may even change the logic level of the disabled output signal during a single disable cycle if, for example, the disable cycle is very long.

Accordingly, the invention is not limited except as by the appended claims.

What is claimed is:

1. An apparatus, comprising:
   a circuit configured to provide an output signal; and
   a counter configured to cause the circuit to disable the output signal at a first logic level for at least a portion of an upcoming disable cycle responsive to the output signal having been disabled at a second logic level during one or more previous disable cycles.

2. The apparatus of claim 1, further comprising a signal distribution circuit coupled to the circuit and configured to receive the output signal of the circuit and to distribute a clock signal responsive to the received output signal.

3. The apparatus of claim 2, wherein the signal distribution circuit comprises a plurality of serially connected inverters, each with at least one pFET and one nFET coupled in series.

4. The apparatus of claim 1, further comprising a level sensitive latch configured to synchronize changes in the output signal to a clock signal.

5. The apparatus of claim 1, wherein the counter is further configured to cause the circuit to disable the output signal at the first logic level for a plurality of consecutive upcoming disable cycles responsive to the output signal having been disabled at the second logic level during a plurality of previous disable cycles.

6. An apparatus, comprising:
   a bimodal disable circuit configured to selectively disable an output signal at least partially in response to an enable signal;
   wherein a logic level of the output signal, when disabled, is based at least in part on one or more previous logic levels at which the output signal has been disabled.

7. The apparatus of claim 6, wherein the bimodal disable circuit is configured to receive the enable signal asynchronously.

8. The apparatus of claim 6, wherein the bimodal disable circuit comprises a first control gate and a second control gate coupled in series, with the first control gate configured to receive a clock signal and the second control gate configured to provide the output signal.

9. The apparatus of claim 8, wherein each of the first and second control gates comprises a NAND gate.

10. The apparatus of claim 8, wherein each of the first and second control gates is configured to receive a control signal from a counter responsive to the one or more previous logic levels at which the output signal has been disabled.

11. A method, comprising:
providing an output signal responsive to an input signal and an enable signal; and
disabling the output signal at alternating logic levels during alternating disable cycles.

12. The method of claim 11, further comprising synchronizing the enable signal with the input signal.

13. The method of claim 11, wherein the output signal is disabled at a logic high level for a first disable cycle and is disabled at a logic low level for a second disable cycle immediately following the first disable cycle.

14. The method of claim 11, wherein a logic level at which the output signal is disabled is based on an accumulated time at which the output signal has been disabled at one or more logic levels.

15. The method of claim 11, further comprising defining disable cycles based on rising or falling edges of the enable signal.

16. A method, comprising:
maintaining a counter indicating a logic level at which an output signal will be disabled for at least a portion of a disable cycle; and
transitioning the logic level indicated by the counter for alternating disable cycles.

17. The method of claim 16, further comprising alternating the logic level at which the output signal is disabled responsive to the transitioning of the logic level.

18. The method of claim 16, wherein the logic level indicated by the counter is transitioned responsive to each rising transition of an enable signal.

19. The method of claim 16, further comprising providing one or more control signals from the counter to one or more control gates, the one or more control gates configured to enable and disable the output signal responsive to the one or more control signals.

20. The method of claim 19, further comprising latching one of the one or more control signals in order to prevent the output signal from glitching.

21. The method of claim 16, wherein the logic level indicated by the counter is transitioned for each successive disable cycle.

* * * * *